Figure 1:
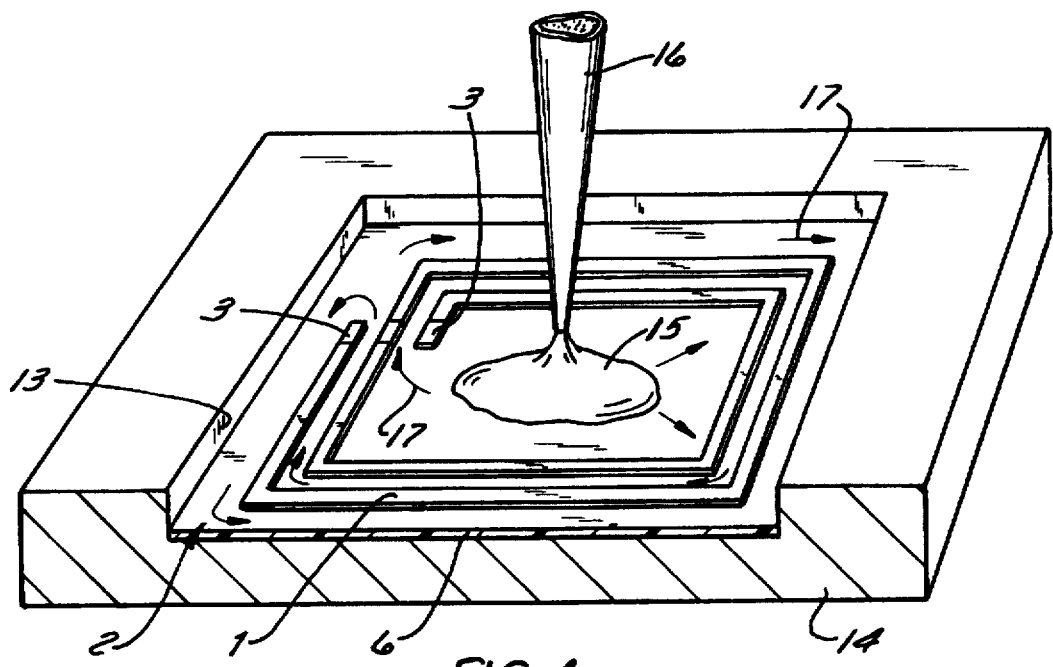

United States Patent [19]

Gloton

[11] Patent Number: 5,767,503
[45] Date of Patent: Jun. 16, 1998

[54] METHOD FOR THE MANUFACTURE OF CONTACT-FREE CARDS

[75] Inventor: Jean-Pierre Gloton, La Ciotat, France

[73] Assignee: Gemplus, Gemenos, France

[21] Appl. No.: 520,924

[22] Filed: Aug. 30, 1995

[30] Foreign Application Priority Data

Sep. 13, 1994 [FR] France .................... 94 10920

[51] Int. Cl.[6] ............................................ G06K 19/00
[52] U.S. Cl. ................................... 238/487; 235/488
[58] Field of Search ........................ 235/491, 487, 235/488, 380, 382, 382.5, 384, 492

[56] References Cited

U.S. PATENT DOCUMENTS

| D. 327,883 | 7/1992 | Gloton | D14/117 |
|---|---|---|---|
| D. 353,135 | 12/1994 | Gloton | D14/177 |
| 4,810,865 | 3/1989 | Gloton et al. | 235/487 |
| 4,864,383 | 9/1989 | Gloton et al. | 357/68 |
| 4,908,937 | 3/1990 | Gloton | 29/840 |
| 4,941,257 | 7/1990 | Gloton | 29/840 |
| 4,943,464 | 7/1990 | Gloton et al. | 428/76 |
| 4,990,759 | 2/1991 | Gloton et al. | 235/492 |
| 5,013,900 | 5/1991 | Hoppe | 235/487 X |
| 5,031,109 | 7/1991 | Gloton | 364/478 |
| 5,214,566 | 5/1993 | Dupre et al. | 361/392 |
| 5,321,240 | 6/1994 | Takahira | 235/380 |
| 5,399,847 | 3/1995 | Droz | 235/487 X |
| 5,412,192 | 5/1995 | Hoss | 235/380 |
| 5,519,201 | 5/1996 | Templeton, Jr. et al. | 235/492 |

FOREIGN PATENT DOCUMENTS

| A-0481776 | 4/1992 | European Pat. Off. . |
|---|---|---|
| U-8909783 | 9/1990 | Germany . |

*Primary Examiner*—Hoanganh T. Le
*Assistant Examiner*—Karl D. Frech
*Attorney, Agent, or Firm*—Nilles & Nilles S.C.

[57] ABSTRACT

Disclosed is a method for the manufacture of a contact-free card comprising an antenna embedded in a card body and connected, by its connection terminals, to the contact zones of an electronic module of the card body as well as a card obtained by such a method. The method comprises depositing a plastic sheet in a cavity of a mold; dispensing liquid plastic material into the cavity; and distributing the material on the surface of the sheet so that it is guided by the antenna in order to form a layer of the card body. The disclosed method can be applied to cards that are exclusively contact-free cards and to combined cards designed for operations such as remote cash operations.

22 Claims, 2 Drawing Sheets

METHOD FOR THE MANUFACTURE OF CONTACT-FREE CARDS

BACKGROUND OF THE INVENTION

1 Field of the Invention

The invention relates to a method for the manufacture of contact-free cards or contact-free portable objects, each having an antenna embedded in a card body and connected, by its connection terminals, to the contact zones of an electronic or electrical module.

The invention does not pertain solely to cards that have exclusively contact-free operation. It also pertains to so-called combined or hybrid cards that have both contact-free operation and operation by contact. Thus, in the present description, the term "contact-free card" shall be applied without distinction to a card or portable object that has either exclusively contact-free operation or combined operation.

Contact-free cards are designed to perform a variety of operations such as, for example, debiting operations, banking operations, telephone calls or various operations of identification. They are designed, for example, for remote cash operations in which a certain number of units are deducted from them remotely when they pass in the vicinity of a terminal, and in which they can also be recharged remotely. In the case of a combined card, the recharging is done in a conventional dispenser of contact-type cards.

The above-mentioned remote operations are performed by means of electromagnetic coupling between the electronic circuitry of the card and a receiver or reader device. This coupling is done in read mode or in read/write mode and the data is transmitted by RF or microwave means.

In the form in which they are made at present, contract-free cards are portable objects with standardized dimensions. The usual standard, which is the ISO 7810 standard, corresponds to a card with a conventional format having a length of 85 mm, a width of 54 mm and a thickness of 0.76 mm.

2. Description of the Prior Art

There are known ways of making contact-free cards by the colamination technique. These methods consist of the placing, between two plates of a press, of a stack of thermoplastic sheets in the middle of which there is placed a contact-free electronic module that is already connected to an antenna. These different thermoplastic sheets are then soldered by the application of pressure and temperature.

However, owing to the differences between the expansion coefficients of the materials used, the combined effect of the pressure and of the temperature causes an aesthetically unsatisfactory residual deformation on the surface of the card and before the electronic module.

There are other known methods for the manufacture of contact-free cards that implement a operation for the simple dispensing of fluid plastic material into an open cavity of a mold. In this cavity there is placed a thermoplastic sheet on which there lies an antenna already connected to an electronic module. The dispensed material then forms a uniform layer that entirely covers the antenna and the module.

Such methods are not suited to the requirements of cost effectiveness in the mass production of cards. Indeed, they do not enable the deferred mounting of the electronic module in a step subsequent to that in which material is dispensed. Thus the rejects, which contain the electronic module, considerably increase the average cost price of a card. Furthermore, these methods do not enable the immediate obtaining of combined cards.

Yet other methods relate to the manufacture of contact-operated cards by the injection of liquid plastic under high pressure into a closed cavity of a mold. These methods could be transposed to the manufacture of contact-free cards.

However, the antenna, which is particularly flimsy and breakable, may then be subjected to the strains of the injection pressure. This makes the method delicate to implement and increases the quantity of rejected cards. Furthermore, during the injection, the electronic module is already connected to the antenna. This burdens the cost price of the cards obtained.

The present invention is aimed at proposing a method for the low-cost manufacture of contact-free cards that overcomes the above-mentioned drawbacks and provides notably for the possibility of mounting the module in a deferred step in order to obtain contact-free cards that have no deformation in front of the electronic module.

SUMMARY OF THE INVENTION

These aims as well as others that shall appear hereinafter are achieved by means of a method for the manufacture of a contact-free card, in which a liquid material is dispensed into an antenna, and then this material is distributed so that it is guided, in its journey, by the antenna itself.

An object of the invention, therefore, is a method for the manufacture of a contact-free card comprising an antenna embedded in a card body and connected, by its connection terminals, to the contact zones of an electronic module of the card body-, wherein said method comprises the following steps, according to which:

- preferably, a plastic sheet is deposited in a cavity of a mold that is preferably horizontal, and the antenna is placed at the bottom of the cavity or on said sheet;
- a liquid plastic material is dispensed, preferably by injection, on to its surface; and
- this material is distributed so that it is guided by the antenna, in order to form a layer of the card body.

The following description which is no way restrictive will provide for a clearer understanding of the way in which the invention can be implemented.

BRIEF DESCRIPTION OF THE DRAWINGS

The description is to be read with reference to the appended drawings, of which:

FIG. 1 shows a view, in perspective, of the dispensing and the guided distribution of the liquid plastic material according to the method of the invention;

FIG. 2 shows a cross-sectional view of the means of applying pressure implemented for the distribution of liquid plastic according to the method of the invention;

FIG. 3 shows a cross-sectional view of a step for the mounting of the electronic module according to a mode of implementation of the method according to the invention. This mounting may be done before or after the step of FIG. 1;

FIGS. 4 and 5 show a cross-sectional view of the step for the mounting of the electronic module according to another mode of implementation of the method of the invention; and FIG. 6 shows a cross-sectional view of a contact-free card obtained according to one of the modes of implementation of the method of the invention.

MORE DETAILED DESCRIPTION

The invention relates to a method for the manufacture of contact-free cards. Such cards have an antenna 1 embedded in a card body 2 and connected by its connection terminals 3 to the contact zones 4 of an electronic module 5.

The card body 2 forms a slim rectangular parallelepiped formed by different layers of plastic 6, 7, 8.

The antenna 1 is placed in a first layer 7 of the card body 2 contained between a lower thermoplastic sheet 6 and an upper layer forming a second layer 8. It is constituted, for example, by a dielectric that is metallized or pasted flat with metal forming a spiral with n turns. The electromagnetic flux going through the antenna 1 is proportional to the number n of turns that it comprises and to the surface area demarcated by said turns. Thus, n is the greatest possible number and the shaping of the turns substantially follows the edges of the card body 2. However, the figures of the present description show a spiral-shaped antenna 1 comprising, with a view to clarity, two turns and leaving the central part of the sheet 6 entirely open. The ends of the spiral forming the antenna 1 constitute the connection terminals 3 which are located close to each other. Furthermore, the antenna 1 may be formed by various methods and notably by punching, chemical etching or the deposition of an adhesion-promoting product on a thermoplastic sheet by a silk-screen printing process, followed by metallization by chemical deposition.

The electronic module 5 is placed in the second layer 8. It comprises, for example, an integrated circuit chip 9 connected by means of conductive wires 10 to a set of metal pads located on its periphery. Two of these pads form the contact zones 4. The other pads form metallizations 11 designed for a contact-type operation of the contact-free card. The metallizations 11 are therefore flush with the surface of the card body 2. The chip 9, the wires 10 and the pads 4, 11 are fixed in a protective resin 12.

In a first preferred step of the method of the invention, the plastic sheet 6 is deposited at the bottom of a cavity 13 of the mold 14.

This cavity 13 is, for example, open. It has a flat bottom and vertical side walls. Its dimensions, namely its length and width, are substantially equal to the dimensions, namely the length and width, of the card to be obtained. However, its depth is greater than or equal to the thickness of the card to be obtained.

The sheet 6 comes into contact with the vertical walls of the cavity 13. The thickness of this sheet is about 180 micrometers for a typical card corresponding to the ISO 7810 standard. This sheet 3 is made, for example, of PVC (polyvinyl chloride), a PC (polycarbonate), ABS (acrylonitrile-butadiene-styrene), PET (polyethylene), PETG (polyethylene terephtalate glycol), PVDF (polyvinylidene fluoride) or any other thermoplastic film having equivalent properties.

In a second step of the method, the antenna 1 is placed on and, as the case may be, bonded to the sheet 6.

This second step may be performed before the first step. The term "to place" must be understood in the broad sense so as to include notably the above-mentioned method of making the antenna by silk-screen printing.

Furthermore, the antenna 1 may also be negative-molded in a mold that receives it entirely, and may be bonded to the thermoplastic sheet after the negative molding. The mold used for the negative molding may have a height limited exactly to the thickness of the antenna.

In a third step, a liquid plastic material 15 is dispensed on to the surface of the sheet 6 on which the antenna 1 lies.

The material 15 is dispensed from the top of the cavity 13, by means of the known prior art methods enabling liquids to be dispensed in determined quantities. The term "liquid" is used herein to describe a state that is the reverse of "paste-like". The dispensing device has been represented by a syringe or micropipette with a tip 16 in FIG. 1. The dispensing is done under low pressure, that is a pressure far lower than the pressure of 700 kg/cm2 commonly used in methods for the manufacture of cards, with material being injected into enclosed cavities that are shallow. Such a pressure is lower than 100 kg/cm2.

The micromodule may be present, connected to the connection terminals of the antenna 1, during the dispensing or injection of the material 15.

The material 15 is designed to form the first layer 7 of the card body 2. It is made, for example, of ABS, a PC, and ABS/PC, PET, a polyamide or any other resin that is liquid at a certain temperature or under certain conditions of pressure, preferably having a high fluidity index in order to foster flow, and that hardens at another temperature, under other conditions, or else in the presence of a catalyst, in particular modified epoxyphenolic polyurethane or non-modified epoxyphenolic polyurethane. The first layer 7 has a thickness substantially equal to the thickness of the antenna 1, namely in the example of the present description, substantially equal to 80 micrometers. The material 15 is thus dispensed directly on to the sheet 6 without covering the antenna 1 and, in particular, without covering the connection terminals of this antenna. Furthermore, the volume of material 15 dispensed is calculated with precision so that, despite the presence of the antenna 1, the first layer 7 has a flat surface.

In one advantageous embodiment of the invention, the material 15 is dispensed substantially on to the center of the upper face of the sheet 6, i.e. at the place furthest from the antenna 1. Thus, the possibility that the deposit of dispensed material 15 may cover the antenna 1, even partially, will be minimal.

In a fourth step of the invention, the liquid plastic material 15 is distributed on the surface of the sheet 6 so that said material 15 is guided, in its journey, by the antenna 1 in order to form the first layer 7 of the card body 2.

In the case of the example of the present description, the antenna 1 has a spiral configuration. The distribution is therefore done in a spiral, along the path indicated by the arrows 17.

Figure 2:
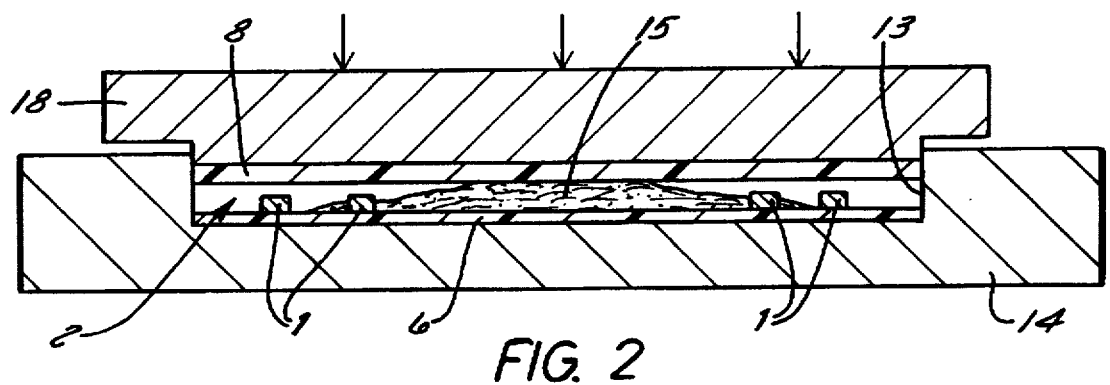

This distribution is done, for example, by means of a gradual pressing of the material 15 using a pressing means. This pressing means, as shown in FIG. 2, may consists of a element 18 having dimensions, namely length and width, that are substantially smaller than those of the cavity 13. The element 18 gets inserted into this cavity 13 and then pushes the deposit of liquid material 15 along the above-mentioned path of distribution 17. Preferably, heat is applied to make the deposited material melt, and the pressing is done gradually.

The distribution of the material 15 is done so that the connection terminals 3 of the antenna are not covered with said material 15.

When the material 15 is solidified, after cooling (in the case of a thermoplastic) or polymerization (in the case of a thermohardening material), an intermediate card structure is obtained. This structure is formed by the thermoplastic sheet 6 (as the case may be) on which there lies the first layer 7 whose thickness is crossed by the antenna 1.

The subsequent steps are designed for the mounting of the electronic module 5 on the above-mentioned structure, the connection of this module 5 to the terminals 3 of the antenna 1 and the forming of the second layer 8 covering the first layer 7. In one example, the thickness of the second layer 8 is 500 micrometers.

Figure 3:
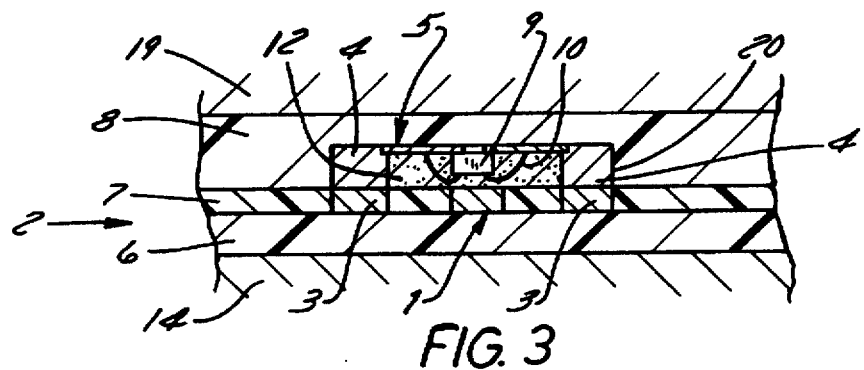

According to a first method of manufacture shown in FIG. 3, the module is mounted by means of an element 19. This element 19 holds the second layer 8 designed to be applied to the surface of the first layer 7.

The second layer 8, preferably obtained by prior molding, has a housing 20 in which the module 5 has also been inserted beforehand. This housing 20 is located so that the connection zones of the module 5 are flush with the lower surface of the second layer 8 and so that, when this second layer 8 is applied to the first layer 7, they come into contact with the connection terminals 3 of the antenna 1. Furthermore, on its lower face, the second layer 8 advantageously has a bonder that improves the quality of its attachment to the first layer 7.

Figure 4:
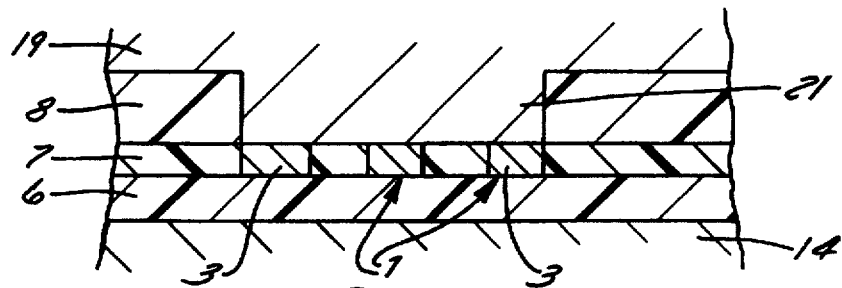
Figure 5:
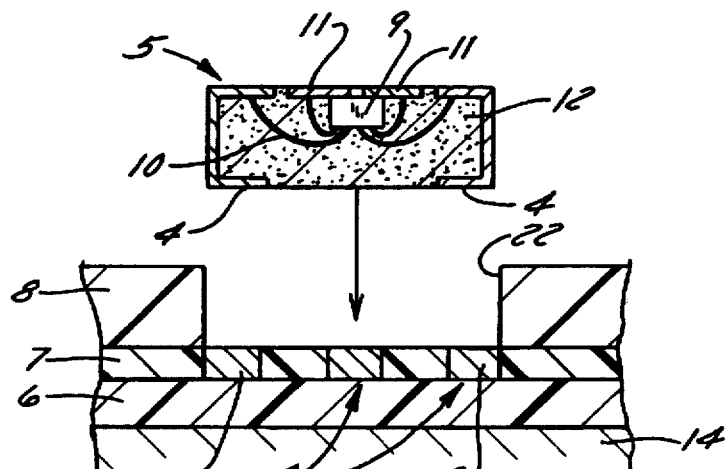

According to a method of manufacture shown in FIGS. 4 and 5, the element 19 has a core 21 designed for the formation, after the second layer 8 is applied to the first layer 7, of a cavity 22 having a depth equal to the thickness of the second layer 8 for the mounting of the module 5.

For the implementation of the invention in the batch manufacture of cards, it is possible advantageously to use perforated bands of the type described in the French patent filed on behalf of the applicant and published under No. 2 673 041.

Figure 6:
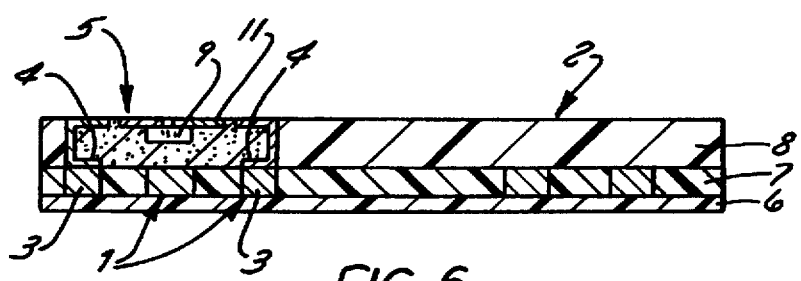

Irrespective of the manufacturing method used, a contact-free card is obtained after the joining, by the pasting (thermoplastic or adhesive) of the second layer 8 flat against the first layer 7 or by the stripping from the mold of the first and second layers 7 and 8 manufactured in one and the same mold. Such a card, of the type shown in FIG. 6, has a lower sheet 6 on which there lies a first layer 7 whose thickness is equal to the thickness of the antenna 1. This first layer 7 is covered with the second layer 8 comprising the module 5.

What is claimed is:

1. A method for the manufacture of a contact-free card comprising an antenna embedded in a card body and connected, by its connection terminals, to the contact zones of an electronic module of the card body, wherein said method comprises the following steps, according to which:

the antenna is placed in a cavity of a mold; then a liquid plastic material is dispensed into the cavity; and then the liquid plastic material is distributed within said cavity so that it is guided by the antenna to form a first layer of the card body which does not cover the connection terminals of the antenna.

2. A method according to claim 1 wherein, prior to the dispensing step, a plastic sheet is deposited into the cavity, and wherein the antenna is then placed on said sheet.

3. A method according to claim 2, wherein the cavity of the mold in which the sheet is deposited has dimensions, namely length and width, that are substantially equal to the dimensions, namely the length and width, of the contact-free card.

4. A method according claim 1, wherein the material is dispensed substantially at the center of the cavity.

5. A method according to claim 1, wherein the distribution is done by pressing the material using a pressing device.

6. A method according to claim 1, wherein the distribution is done in a spiral, the antenna itself having a spiral shape.

7. A method according to claim 1, wherein, above the first layer, there is formed a second layer of the card body which receives the electronic module.

8. A method according to claim 7, wherein the second layer has a housing in which the electronic module is inserted before the second layer is inserted into said cavity.

9. A method according to claim 1, further comprising connecting the contact zones of the electronic module to the connection terminals of the antenna following the step of dispensing the liquid plastic material into the cavity.

10. A method according to claim 9, wherein the step of connecting the contact zones of the electronic module to the connection terminals of the antenna is performed following the formation of the first layer of the card body.

11. A method according to claim 10, wherein the material solidifies prior to the step of connecting the contact zones of the electronic module to the connection terminals of the antenna.

12. A method for the manufacture of a contact free card, comprising:

providing a mold having a cavity formed therein; then placing an antenna in the cavity, the antenna having connection terminals; then dispensing a liquid plastic material into the cavity; then distributing the liquid plastic material, while using the antenna to guide material flow through the cavity, to form a first layer of a card body that does not cover the connection terminals of the antenna; and then connecting contact zones of an electronic module to the connection terminals of the antenna.

13. A method as defined in claim 12, further comprising depositing a plastic sheet in the cavity prior to the step of placing the antenna in the cavity, and wherein the antenna is positioned on top of the sheet.

14. A method as defined in claim 12, wherein the antenna is formed from multiple loops and has a spiral shape, and wherein, during the step of distributing the liquid plastic material, the material flows between the loops of the antenna in a spiral.

15. A method as defined in claim 12, wherein the step of distributing the liquid plastic material is performed by pressing the material from above to cause the material to flow.

16. A method as defined in claim 12, further comprising, prior to the step of connecting the connection zones of the electronic module to the terminals of the antenna, imbedding the electronic module in a second layer of the card body and then positioning the second layer over the first layer.

17. A method according to claim 12, wherein the plastic material solidifies prior to the step of connecting the contact zones of the electronic module to the connection terminals of the antenna.

18. A contact-free card comprising:

a plastic sheet;

a first distinct plastic layer disposed on top of said plastic sheet;

an antenna imbedded in said first plastic layer and having connection terminals on an upper surface thereof, wherein said first plastic layer and said antenna are of substantially equal average thickness so that said first plastic layer does not cover said connection terminals and wherein said first plastic layer is formed by placing the antenna in a cavity of a mold dispensing a liquid plastic material into the cavity, and then distributing the liquid plastic material while using the antenna to guide material flow through the cavity;

a second distinct plastic layer disposed on top of said first plastic layer; and an electronic module imbedded in said second plastic layer and having connection zones which extend downwardly from said plastic layer and into electrical contact with said connection terminals of said antenna.

19. A method for the manufacture of a contact free card, comprising:

provid ing a mold having a cavity formed therein; then placing an antenna in the cavity, the antenna having connection terminals; then dispensing a liquid plastic material into the cavity under a pressure lower than 100 kg/cm$^2$; then distributing the liquid plastic material, while using the antenna to guide material flow through the cavity, to form a first layer of a card body.

20. A method as defined in claim 19, wherein the first layer of the card body does not cover the connection terminals of the antenna.

21. A method as defined in claim 20, further comprising connecting contact zones of an electronic module to the connection terminals of the antenna following the distributing step.

22. A method as defined in claim 19, further comprising attaching a micromodule to the connection terminals of the antenna prior to the dispensing step.

* * * * *